(12) United States Patent
Tian

(10) Patent No.: US 6,507,083 B1
(45) Date of Patent: Jan. 14, 2003

(54) IMAGE SENSOR WITH LIGHT-REFLECTING VIA STRUCTURES

(75) Inventor: Hui Tian, Stanford, CA (US)

(73) Assignee: Pixim, Inc., Mt. View, CA (US)

( * ) Notice: Subject to any disclaimer, the term of this patent is extended or adjusted under 35 U.S.C. 154(b) by 56 days.

(21) Appl. No.: 09/680,087

(22) Filed: Oct. 5, 2000

(51) Int. Cl.[7] .......................................... H01L 31/0232
(52) U.S. Cl. ....................... 257/432; 257/435; 257/436
(58) Field of Search ................................ 257/432, 435, 257/436

(56) References Cited

U.S. PATENT DOCUMENTS

| | | | |
|---|---|---|---|
| 5,352,920 A | 10/1994 | Morishita et al. | 257/435 |
| 5,461,425 A | 10/1995 | Fowler et al. | 348/294 |
| 5,552,630 A | 9/1996 | Miyake | 257/435 |
| 6,057,586 A | 5/2000 | Bawolek et al. | 257/435 |
| 6,100,556 A | 8/2000 | Drowley et al. | 257/292 |
| 6,259,083 B1 * | 7/2001 | Kimura | |
| 6,278,169 B1 * | 8/2001 | Sayuk et al. | |
| 6,362,513 B2 * | 3/2002 | Wester | |

* cited by examiner

Primary Examiner—Stephen D. Meier
(74) Attorney, Agent, or Firm—Steve Mendelson; Yuri Gruzdkov; Joe Zheng

(57) ABSTRACT

An image sensor has a light-shielding layer with openings corresponding to an array of light-sensing elements formed below on a substrate. Light-reflecting material is applied to form (e.g., vertical) via walls between each opening in the light-shielding layer and the corresponding light-sensing element. Light having a non-normal angle of incidence will reflect off the vertical light-reflecting via structures towards the light-sensing elements. As such, substantially all of the light that passes through an opening in the light-shielding layer will reach the light-sensing element, even light incident at relatively low angles, thereby reducing the problem of pixel vignetting associated with prior art image sensors. As a result, the image sensor has a greater and more uniform sensitivity across the entire sensor array.

7 Claims, 6 Drawing Sheets

IMAGE SENSOR WITH LIGHT-REFLECTING VIA STRUCTURES

BACKGROUND OF THE INVENTION

1. Field of the Invention

The present invention relates to semiconductor devices, and, in particular, to integrated image/light sensors, such as MOS image sensors, having a light-shielding layer.

2. Description of the Related Art

Image sensors typically employ an array of light-sensing elements (e.g., photodiodes) to generate electrical signals representing light incident on the device. In addition to the array of light-sensing elements, an image sensor typically includes associated circuitry for selectively reading out the electrical signal generated by the individual elements. The light-sensing elements operate by the well-known photoelectric effect by which the incidence of photons of light on each element generates electrons that constitute the electrical signal from that element. Image sensors may be implemented using color filter arrays (e.g., comprising distributions of different color elements, each of which is responsive to one of red, green, and blue light) to generate color output.

As CMOS technology scales down to deep submicron regimes, the aspect ratio becomes smaller. Here, the aspect ratio is the ratio of the width of an opening in a light-shielding layer and the vertical distance from the light-shielding layer to the corresponding light-sensing element. As the aspect ratio decreases, more and more "off axis" light (i.e., light incident at a non-normal angle) cannot reach the light-sensing element, resulting in the so-called pixel vignetting phenomenon. This often leads to a significant reduction in sensor sensitivity. It can also result in significant non-uniformity in pixel response over the sensor array.

FIG. 1A shows a cross-sectional view of a portion of an image sensor 100 of the prior art. Image sensor 100 has a transparent dielectric layer 102 formed over a substrate 104. Disposed within dielectric layer 102 is an opaque light-shielding layer 106 having a pattern of transparent openings 108 that selectively allows incident light to pass through dielectric layer 102 towards an array of light-sensing elements 110 formed on substrate 104 at the interface between dielectric layer 102 and substrate 104. Each light-sensing element 110 corresponds with one of the transparent openings 108 in light-shielding layer 106.

In an ideal situation, light always impinges upon image sensor 100 at a normal angle (i.e., perpendicular to both light-shielding layer 106 and the array of light-sensing elements 110). In that case, all of the light that passes through each transparent opening 108 in light-shielding layer 106 reaches the corresponding light-sensing element 110 below. In reality, however, depending on the situation, at least some if not all of the light is incident at non-normal angles and, in those cases, at least some of the light passing through a transparent opening 108 does not reach the corresponding light-sensing element 110.

FIG. 1A shows an exemplary situation of a light source (not shown) positioned at a relatively close distance directly over image sensor 100. In this case, essentially all of the light that passes through transparent opening 108c reaches corresponding light-sensing element 110c. However, due to the relatively small aspect ratio of image sensor 100, some of the light passing through transparent openings 108b and 108d will not reach corresponding light-sensing elements 110b and 110d, respectively, and even less of the light passing through transparent openings 108a and 108e will reach corresponding light-sensing elements 110a and 110e. The light falling outside of the light-sensing elements 110 will impinge on other regions 112 of the substrate 104 between those light-sensing elements 110, which regions 112 might not be light sensitive and will, in any case, not contribute appropriately to the electrical signal generated by light-sensing elements 110.

FIG. 1B illustrates the pixel vignetting that results from the geometry shown in FIG. 1A for off-axis elements, such as elements 110a and 110e. In particular, FIG. 1B shows a top view of the active area of a light-sensing element 110 and the actual light pattern 114 that impinges on substrate 104 after passing through the corresponding transparent opening 108. As shown in FIG. 1B, light pattern 114 is offset from element 110. This offset reduces the sensitivity of this element in the image sensor to such light.

SUMMARY OF THE INVENTION

The present invention addresses the problem of pixel vignetting by providing an image sensor having a reflective optical path between the light-shielding layer disposed within the transparent dielectric layer and each of one or more light-sensing elements formed on the substrate below. Each reflective optical path is preferably implemented using a reflective liner formed in a via between the light-shielding layer and a corresponding light-sensing element. The reflective paths help to direct non-normal incident light towards the appropriate light-sensing elements, thereby enhancing sensor sensitivity as well as uniformity of response across the sensor array.

In one embodiment, the present invention is an integrated sensor comprising (a) one or more light-sensing elements formed on a substrate; and (b) a light-reflecting structure for each light-sensing element, configured within intervening structure above the substrate to reflect incident light towards the light-sensing element.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1A:
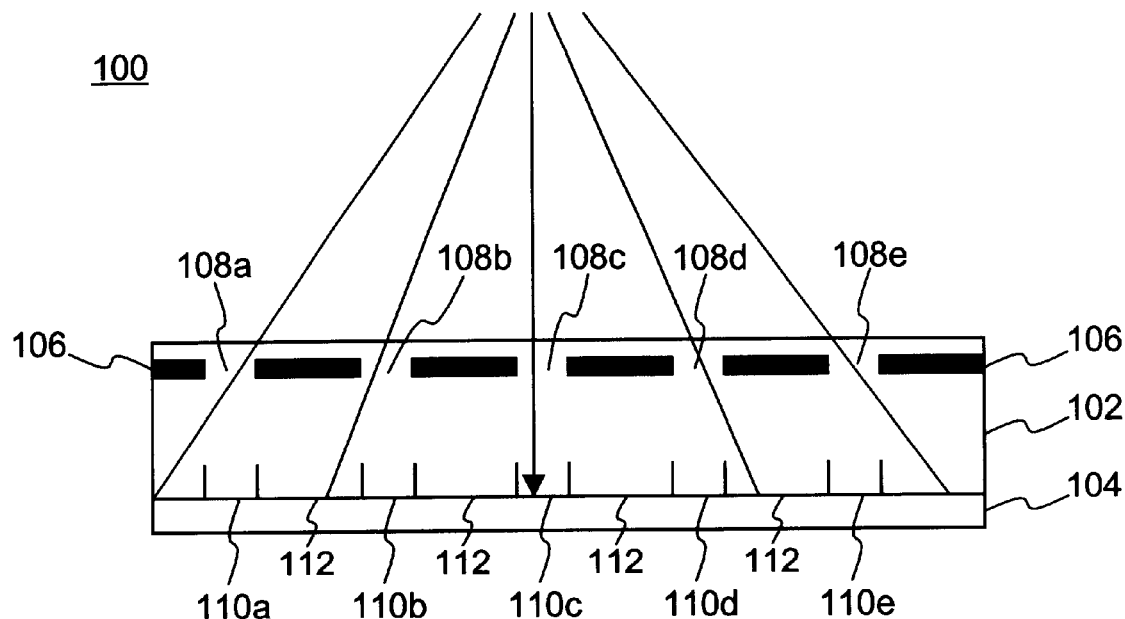
FIG. 1A shows a cross-sectional view of a portion of an image sensor of the prior art.
Figure 1B:
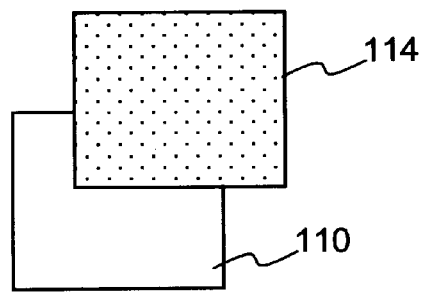
FIG. 1B illustrates the pixel vignetting that results from the geometry shown in FIG. 1A for off-axis elements.
Figure 2A:
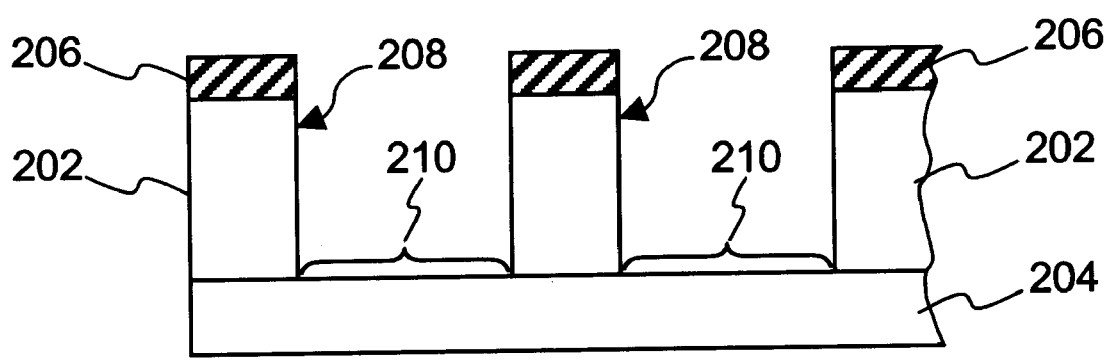
FIGS. 2A–C shows cross-sectional views illustrating a preferred process for fabricating an image sensor, according to one embodiment of the present invention.
Figure 2B:
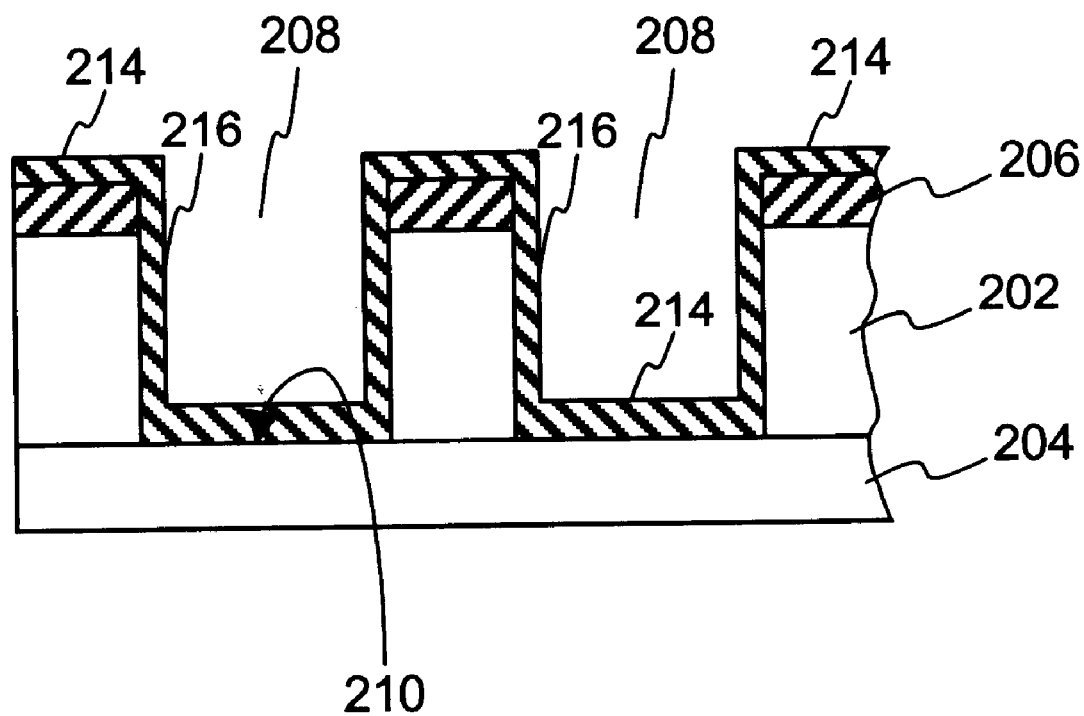
Figure 2C:
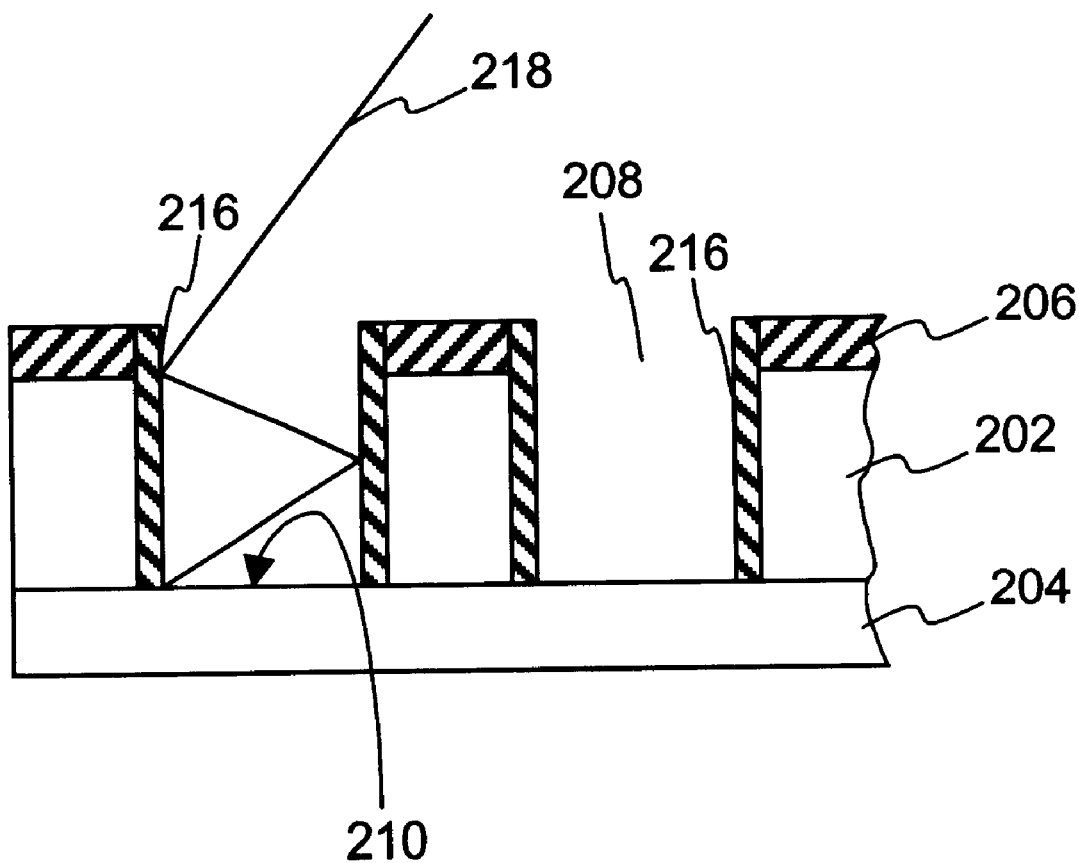

FIGS. 2A–C shows cross-sectional views illustrating a preferred process for fabricating an image sensor 200, according to one embodiment of the present invention. In particular, FIGS. 2A–C show a portion of image sensor 200 at first, second, and third intermediate stages, respectively, during the fabrication process.

At the first intermediate stage shown in FIG. 2A, image sensor 200 comprises an opaque light-shielding layer 206 formed on top of a transparent dielectric layer 202, which is itself formed on top of a substrate 204, where a pattern of openings 208 in light-shielding layer 206 and dielectric layer 202 expose an array of light-sensing elements 210 formed on substrate 204.

The structures shown in FIG. 2A can be fabricated by (1) forming the array of light-sensing elements 210 on substrate 204, (2) forming dielectric layer 202 over substrate 204, (3) forming light-shielding layer 206 over dielectric layer 202, and (4) selectively removing portions of light-shielding layer 206 and dielectric layer 202 to form openings 208 (e.g., using conventional photolithographic processes such as resist coat, expose, develop, etch, and strip) to expose light-sensing elements 210.

The second intermediate stage shown in FIG. 2B is achieved by applying a light-reflecting layer to all of the exposed surfaces of FIG. 2A, including the exposed sidewalls of light-shielding layer 206 and dielectric layer 202 within each opening 208. As shown in FIG. 2B, the light-reflecting layer comprises both horizontal portions 214 as well as vertical portions 216. The light-reflecting layer can be applied by conventional material deposition processes at a thickness anywhere from tens of nanometers to about 1 micron, where the layer should be thick enough to reflect incident light without being so thick that it significantly reduces the area of the opening.

The third intermediate stage shown in FIG. 2C is achieved by removing (e.g., by anisotropic etching) the horizontal portions 214 of the light-reflecting layer of FIG. 2B from both light-shielding layer 206 as well as from light-sensing elements 210, leaving only the vertical portions 216 of the light-reflecting layer located on the sidewalls within each opening 208. Fabrication of image sensor 200 can then be completed, as appropriate, with the application of one or more additional layers (including filling in each opening 208 with transparent dielectric material) to form desired features such as color filters, lenses, or even additional light-shielding layers. Depending on the exact implementation, when completed, vertical portions 216 will form light-reflecting vias between light-shielding layer 206 and substrate 204 for each opening 208 in light-shielding layer 206.

Alternatively, the light-reflecting via structure for each opening 208 may be formed using standard metal via processing, in which a metal via is built around the light-sensing diode every time a dielectric oxide layer is grown between two metal layers in the intervening structure, such that the resulting stacked vias serve as the light-reflecting structure. In this case, no extra processing step is performed to apply a separate light-reflecting layer.

As indicated in FIG. 2C, off-axis light 218 that passes through each opening 208 in light-shielding layer 206 reflects off the corresponding vertical light-reflecting portions 216 and eventually falls on the corresponding light-sensing element 210. As a result, substantially all of the light that passes through each opening 208 will reach the corresponding light-sensing element 210, even for relatively low angles of incidence. As such, the present invention enables the implementation of image sensors with greater and more uniform sensitivity across the entire sensor array.

In general, each light-sensing element 210 formed on substrate 204 may be any suitable type of device for converting incident light within a desired wavelength range into an electrical signal, including photoconductors, photodetectors, phototransistors, or photodiodes. For example, a metal semiconductor photodiode having a PIN structure or a heterojunction photodiode (e.g., GaAs photodiode) can be employed as a light-sensing element. Alternatively, a Schottky diode structure or a photo-gate structure can be employed.

Figure 3:
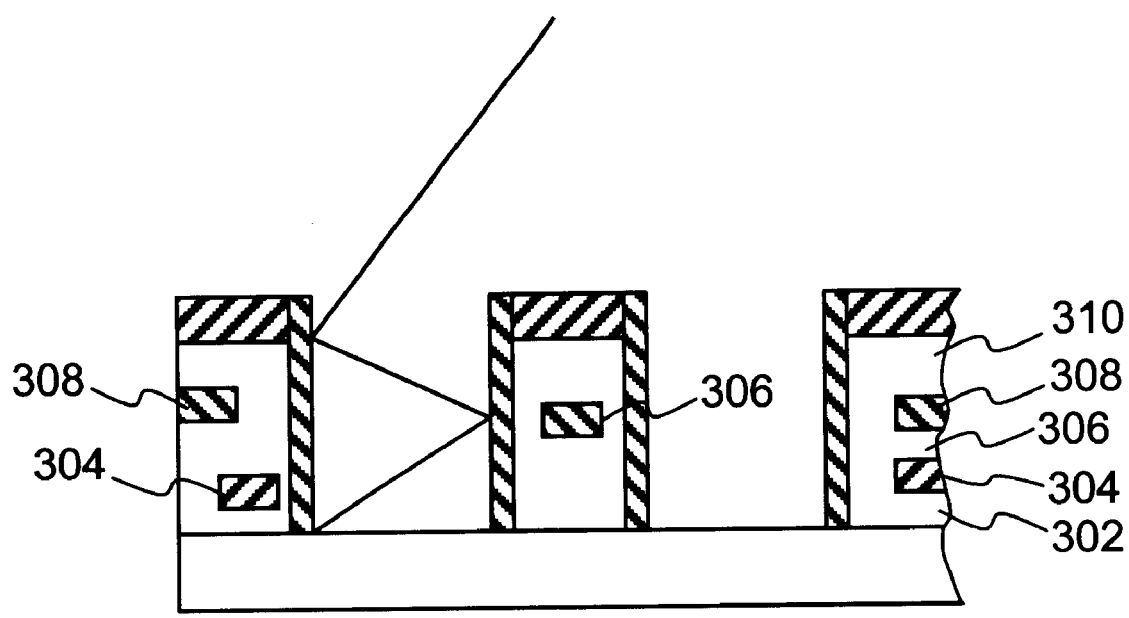
FIG. 3 shows a portion of an image sensor in which the intervening structure between the light-shielding layer and the array of light-sensing elements, comprises two metal layers and disposed between three dielectric layers, according to an alternative embodiment of the present invention.

Although image sensor 200 has been described in the context of FIGS. 2A–C as having a single dielectric layer 202 between light-shielding layer 206 and substrate 204, in general, the intervening structure between light-shielding layer 206 and substrate 204 may comprise a plurality of different structural layers. For example, the intervening structure could comprise two or more dielectric layers with one or more conductive (e.g., metal) layers there between. FIG. 3, for example, shows a portion of an image sensor 300 in which the intervening structure comprises metal layers 304 and 308 disposed between dielectric layers 302, 306, and 310, according to an alternative embodiment of the present invention. In all of these embodiments, the volume directly above each light-sensing element is filled with material that is transparent to light in the desired wavelength range, such as a suitable dielectric material.

Light-shielding layer 206 may be made of any suitable material that is opaque to light in the desired wavelength range. For example, depending on the implementation, light-shielding layer 206 may be formed from an opaque metal or non-conductive material such as a polymer (e.g., polyethylene or polyester with proper fillers).

The light-reflecting layer may be made of any suitable material that reflects light in the desired wavelength range. Depending on the implementation, the light-reflecting material may be a conductive material, such as a metal (e.g., aluminum, copper, or alloys thereof), or a non-conductive material, such as a polymer (e.g., polyethylene or polyester with proper fillers).

Figure 4:
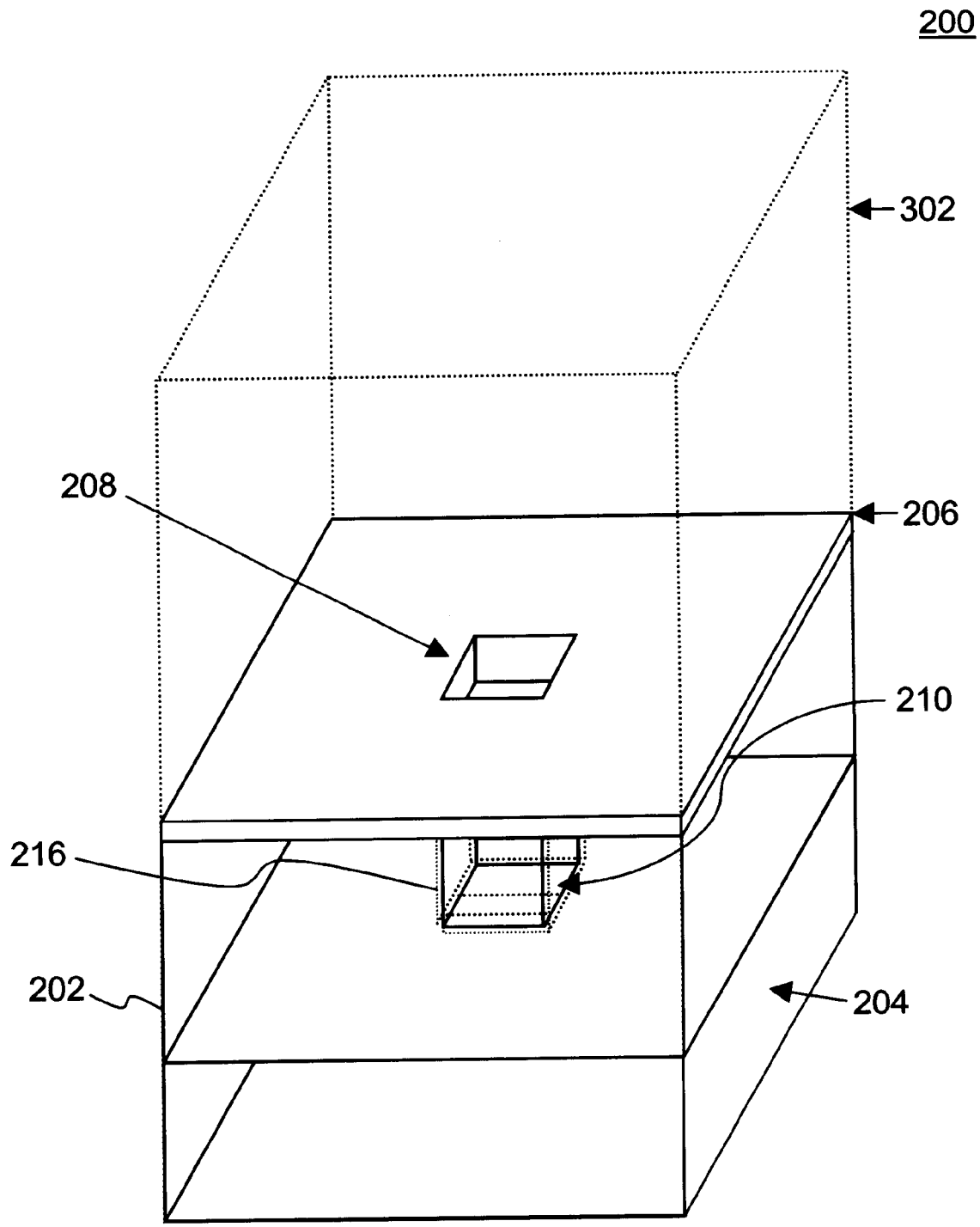
FIG. 4 shows an isotropic view of a rectilinear portion of the image sensor of FIGS. 2A–C corresponding to single light-sensing element.

FIG. 4 shows an isotropic view of a rectilinear portion of image sensor 200 corresponding to single light-sensing element 210. As shown in FIG. 3, square opening 208 in light-shielding layer 206 corresponds with square light-sensing element 210 formed in substrate 204 with four vertical walls within dielectric layer 202 defining a three-dimensional light-reflecting via 216. Structure 302 represents one or more layers that may be formed on top of light-shielding layer 206.

In general, the present invention may be implemented for image sensors having one or more light-sensing elements arranged in either a one- or two-dimensional pattern, such as an array of elements arranged in rows and columns. The elements within a given sensor array as well as the corresponding openings in the light-shielding layer may have the same or different areas and/or shapes, including rectangles or circles instead of squares.

The present invention has been described in the context of light-sensing elements having corresponding openings with vertical light-reflecting walls. In alternative embodiments, the light-reflecting walls may be non-vertical (e.g., sloped) such that each opening has a conformal shape that "focuses" additional light towards the corresponding light-sensing element.

The present invention has also been described in the context of image sensors having a separate light-shielding layer that is formed before the light-reflecting layer is applied. In alternative embodiments, the horizontal portions of the light-reflecting layer that are formed on top of the intervening structure may be retained to function as the light-shielding layer. In that case, the step of forming a separate light-shielding layer is avoided.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. An integrated sensor comprising:

one or more light-sensing elements formed on a substrate; and a light-reflecting structure for each light-sensing element, configured within intervening structure above the substrate to reflect incident light towards the light-sensing element;

a light-shielding layer formed over the intervening structure and defining a transparent opening corresponding to each light-sensing element such that light passing through each opening in the light-shielding layer is reflected by a corresponding light-reflecting structure towards a corresponding light-sensing element.

2. The invention of claim 1, wherein the sensor comprises a plurality of light-sensing elements and a plurality of corresponding light-reflecting structures.

3. The invention of claim 1, wherein each light-reflecting structure is a vertical via structure formed within the intervening structure.

4. The invention of claim 1, wherein each light-reflecting structure is a non-vertical via structure formed within the intervening structure.

5. The invention of claim 1, wherein the intervening structure comprises a transparent material within each light-reflecting structure.

6. The invention of claim 5, wherein the intervening structure further comprises one or more layers of non-transparent material outside of the one or more light-reflecting structures.

7. The invention of claim 1, wherein the sensor comprises a plurality of light-sensing elements and a plurality of corresponding light-reflecting structures;

each light-reflecting structure is a via structure formed within the intervening structure;

the intervening structure comprises a transparent material within each light-reflecting structure; and the intervening structure further comprises one or more layers of non-transparent material outside of the one or more light-reflecting structures.

* * * * *